United States Patent
Dellas

(10) Patent No.: US 10,026,817 B2
(45) Date of Patent: Jul. 17, 2018

(54) LOW-STRESS LOW-HYDROGEN LPCVD SILICON NITRIDE

(71) Applicant: Texas Instruments Incorporated, Dallas, TX (US)

(72) Inventor: Nicholas Stephen Dellas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/409,970

(22) Filed: Jan. 19, 2017

(65) Prior Publication Data

US 2017/0133472 A1    May 11, 2017

Related U.S. Application Data

(62) Division of application No. 14/706,941, filed on May 7, 2015, now Pat. No. 9,580,304.

(51) Int. Cl.
| | |
|---|---|
| *H01L 29/66* | (2006.01) |
| *H01L 29/40* | (2006.01) |
| *H01L 29/778* | (2006.01) |
| *H01L 29/20* | (2006.01) |
| *H01L 29/205* | (2006.01) |

(52) U.S. Cl.
CPC ........ *H01L 29/408* (2013.01); *H01L 29/2003* (2013.01); *H01L 29/205* (2013.01); *H01L 29/7787* (2013.01)

(58) Field of Classification Search
CPC . H01L 29/2003; H01L 29/205; H01L 29/408; H01L 29/7787; H01L 2924/13062; H01L 2924/12032
See application file for complete search history.

(56) References Cited

U.S. PATENT DOCUMENTS

| | | | |
|---|---|---|---|
| 4,538,343 A | 9/1985 | Pollack et al. | |
| 5,326,649 A | 7/1994 | Kashida et al. | |
| 6,211,033 B1 | 4/2001 | Sandhu et al. | |
| 6,214,697 B1 | 4/2001 | Moore et al. | |
| 7,863,648 B2 * | 1/2011 | Miyamoto | H01L 29/402 |
| | | | 257/189 |
| 8,063,434 B1 | 11/2011 | Polishchuk et al. | |
| 2001/0028100 A1 * | 10/2001 | Schmitz | H01L 23/3171 |
| | | | 257/649 |
| 2003/0178633 A1 | 9/2003 | Flynn et al. | |
| 2005/0112817 A1 | 5/2005 | Cheng et al. | |

(Continued)

OTHER PUBLICATIONS

Tonnberg Sofia. Optimisation and Characterisation of LPCVD Silicon Nitride Thin Film Growth. Chalmers University of Technology, Goteborg, Sweden, 2006, p. 22, 23, Fig. 5.3.

(Continued)

*Primary Examiner* — Yosef Gebreyesus

(74) *Attorney, Agent, or Firm* — Jacqueline J. Garner; Charles A. Brill; Frank D. Cimino

(57) ABSTRACT

A microelectronic device contains a high performance silicon nitride layer which is stoichiometric within 2 atomic percent, has a low stress of 600 MPa to 1000 MPa, and has a low hydrogen content, less than 5 atomic percent, formed by an LPCVD process. The LPCVD process uses ammonia and dichlorosilane gases in a ratio of 4 to 6, at a pressure of 150 millitorr to 250 millitorr, and at a temperature of 800° C. to 820° C.

13 Claims, 4 Drawing Sheets

(56) References Cited

U.S. PATENT DOCUMENTS

| | | |
|---|---|---|
| 2008/0023727 A1* | 1/2008 | Hoshi ................ H01L 29/402 |
| | | 257/194 |
| 2008/0035934 A1 | 2/2008 | Sheppard et al. |
| 2010/0317164 A1* | 12/2010 | Komatani ......... H01L 21/28264 |
| | | 438/172 |
| 2011/0079822 A1 | 4/2011 | Kanamura |
| 2011/0187798 A1 | 8/2011 | Rogers et al. |
| 2011/0297961 A1 | 12/2011 | Bunin et al. |
| 2012/0021597 A1 | 1/2012 | Araya et al. |
| 2012/0104505 A1 | 5/2012 | Henson |
| 2012/0255932 A1 | 10/2012 | Tabib-Azar et al. |
| 2013/0178031 A1 | 7/2013 | Ramkumar et al. |
| 2013/0341679 A1 | 12/2013 | Green et al. |
| 2014/0103486 A1 | 4/2014 | Li et al. |
| 2014/0197460 A1 | 7/2014 | Makiyama |
| 2014/0327010 A1 | 11/2014 | Pendharkar et al. |
| 2015/0004421 A1 | 1/2015 | Fujiwara et al. |

OTHER PUBLICATIONS

Gardeniers J.G.E. et al. LPCVD Silicon-Rich Silicon Nitride Films for Applications in Micromechanics, studied with Statistical Experimental Design. J. Vac. Sci. Technol. A 14(5), Sep./Oct. 1996, p. 2879-2892, p. 2879, 2884.

Weber Hao Jim K. J. et al. Characterisation of Low Pressure Chemical Vapour Deposited Si3N4 films. Deniation Renewables—ANZSES 2006, p. 1.

Joshi B C et al. LPCVD and PECVD Silicon Nitride for Microelectronics Technology, Indian Journal of Engineering & Materials Sciences, vol. 7, Oct.-Dec. 2000, pp. 303-309.

* cited by examiner

US 10,026,817 B2

LOW-STRESS LOW-HYDROGEN LPCVD SILICON NITRIDE

CROSS REFERENCE TO RELATED APPLICATIONS

This application is a divisional of U.S. Nonprovisional patent application Ser. No. 14/706,941, filed May 7, 2015, the contents of which is herein incorporated by reference in its entirety.

FIELD OF THE INVENTION

This invention relates to the field of microelectronic devices. More particularly, this invention relates to silicon nitride layers in microelectronic devices.

BACKGROUND OF THE INVENTION

It is desirable to form stoichiometric silicon nitride layers in microelectronic devices which simultaneously have low stress, that is less than 1000 megapascals (MPa), and low hydrogen content, that is less than 5 atomic percent. Such films would be useful for a variety of microelectronic applications. Silicon nitride films formed by plasma enhanced chemical vapor deposition (PECVD) may have low stress, but have high hydrogen content, above 15 atomic percent, which can cause reliability problems and poor etch resistance. Films formed by low pressure chemical vapor deposition (LPCVD) have low hydrogen content, but high stress, above 1000 MPa, which can cause device performance problems.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device contains a high performance silicon nitride layer which is stoichiometric within 2 atomic percent, has a low stress of 600 MPa to 1000 MPa, and has a low hydrogen content, less than 5 atomic percent. The high performance silicon nitride layer is formed by an LPCVD process. The LPCVD process uses ammonia and dichlorosilane gases in a ratio of 4 to 6, at a pressure of 150 millitorr to 250 millitorr, and at a temperature of 800° C. to 820° C.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A high performance silicon nitride layer, which is stoichiometric within 2 atomic percent, has a low stress of 600 MPa to 1000 MPa, and has a low hydrogen content, less than 5 atomic percent, is formed by an LPCVD process. The LPCVD process uses ammonia and dichlorosilane gases in a ratio of 4 to 6, at a pressure of 150 millitorr to 250 millitorr, and at a temperature of 800° C. to 820° C. The combination of stoichiometry, low stress and low hydrogen content were not expected to be provided by the disclosed process conditions, and were discovered during investigations of LPCVD processes when the invention was made. For the purposes of this disclosure, stoichiometric silicon nitride is understood to have a silicon:nitrogen atomic ratio of 3:4.

Figure 1:
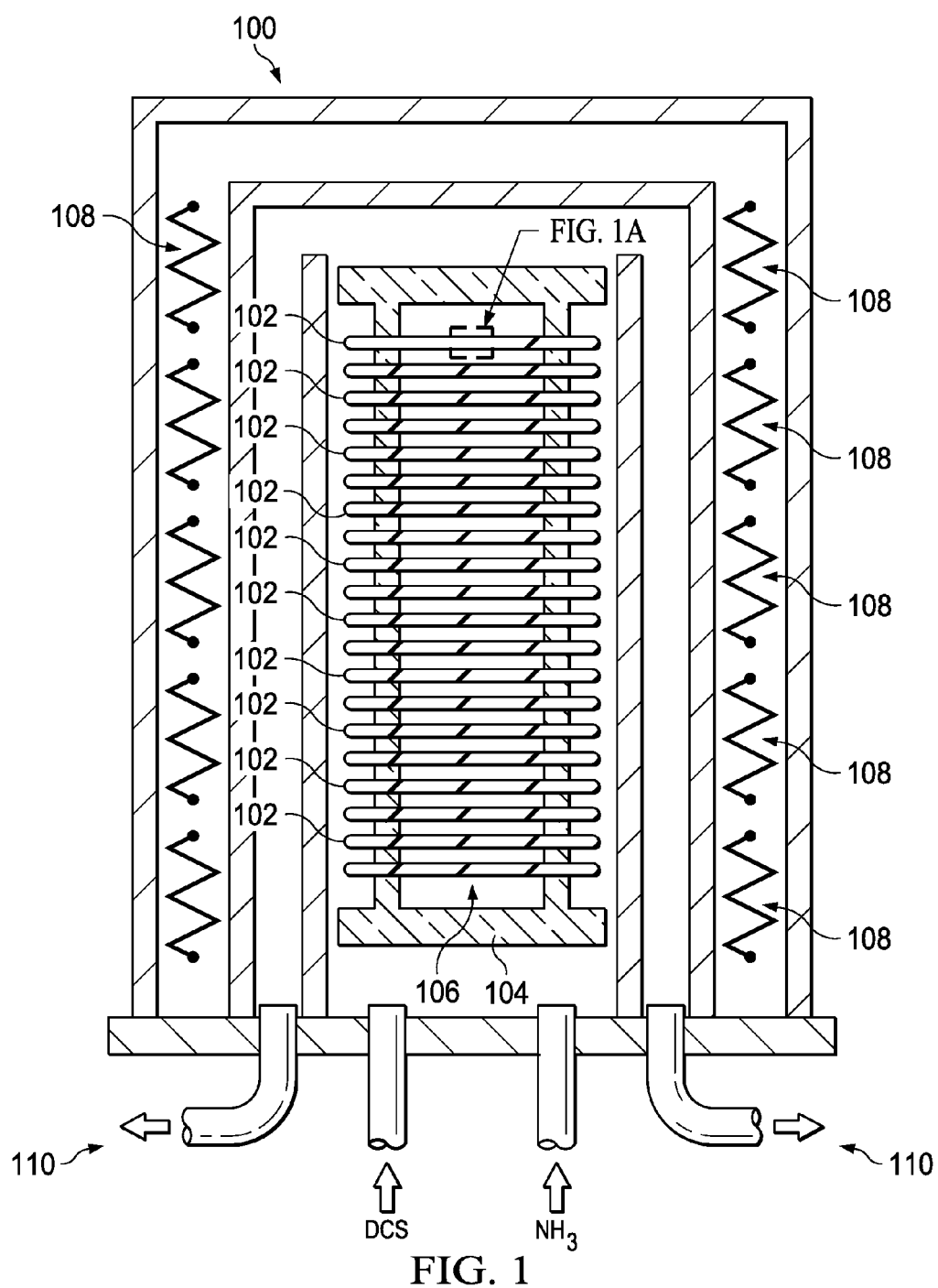
FIG. 1 depicts an LPCVD furnace in an example process of forming a high performance silicon nitride on microelectronic devices and FIG. 1A is an expanded view of the silicon nitride layer formed on the microelectronic devices within the furnace of FIG. 1.
Figure 1A:
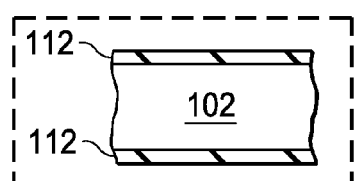

FIG. 1 depicts an LPCVD furnace in an example process of forming a high performance silicon nitride on microelectronic devices. The LPCVD furnace 100 holds a plurality of the microelectronic devices 102, on substrates such as semiconductor wafers, in a boat 104. The boat 104 is held in a reaction chamber 106 of the LPCVD furnace 100. The reaction chamber 106 is heated to a temperature of 800° C. to 820° C. by heating elements 108 of the LPCVD furnace 100 disposed around the reaction chamber 106. Ammonia ($NH_3$) and dichlorosilane (DCS) gases are introduced into the reaction chamber 106 at a ratio of 4 to 6. Pressure inside the reaction chamber 106 is maintained at 150 millitorr to 250 millitorr by an exhaust system 110, for example comprising a combination of an exhaust pump and an adjustable exhaust valve. The high performance silicon nitride layer 112 is formed on the microelectronic devices 102 by reaction of nitrogen in the ammonia and silicon in the dichlorosilane. Formation of the high performance silicon nitride layer 112 is continued until a desired thickness is attained. Subsequently, flows of the ammonia and dichlorosilane are ended and the microelectronic devices 102 are extracted from the LPCVD furnace 100.

Formation of the high performance silicon nitride layer 112 by maintaining the temperature at 800° C. to 820° C., the ratio of ammonia to dichlorosilane at 4 to 6, and the pressure at 150 millitorr to 250 millitorr advantageously provides a silicon:nitrogen atomic ratio within 2 percent of the ratio 3:4, a low stress of 600 MPa to 1000 MPa, and a low hydrogen content of less than 5 atomic percent. The high performance silicon nitride layer 112 may have an index of refraction of 2.0 to 2.1 as a result of being formed by the process described in reference to FIG. 1. Further, the high performance silicon nitride layer 112 may have a dielectric breakdown strength of greater than 12 megavolts per centimeter (MV/cm), which may advantageously contribute to higher reliability of the microelectronic devices 102. Increasing the ratio of ammonia to dichlorosilane reduces the stoichiometry and the dielectric breakdown strength, which may disadvantageously contribute to lower reliability. Reducing the ratio of ammonia to dichlorosilane disadvantageously increases the stress. Reducing the temperature and increasing the pressure also disadvantageously increases the stress.

Figure 2:
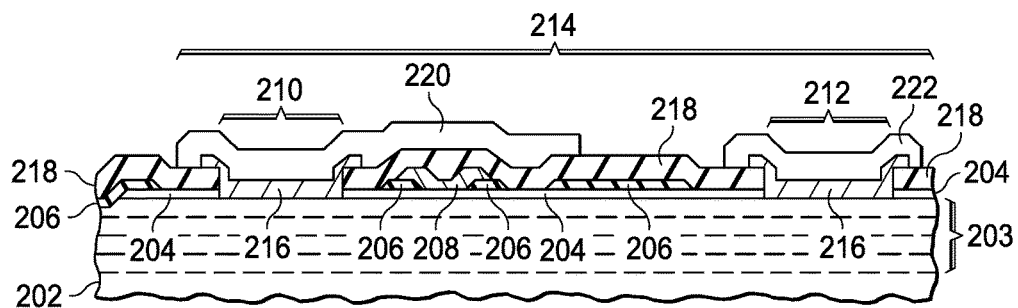
FIG. 2 is a cross section of an example semiconductor device with a high performance silicon nitride layer.

FIG. 2 is a cross section of an example semiconductor device with a high performance silicon nitride layer. The semiconductor device 200 is formed on a semiconductor substrate 202 which may be, for example a stack of gallium nitride and aluminum gallium nitride epitaxial layers 203, and possibly other III-V layers. A cap layer 204 of gallium nitride is disposed on the substrate 202. A high performance silicon nitride layer 206 is disposed on the cap layer 204 on two sides of a gate 208 and between a source 210 and drain 212 of a gallium nitride field effect transistor (GaN FET) 214 of the semiconductor device 200. The gate 208 may partially overlap the high performance silicon nitride layer 206. The high performance silicon nitride layer 206 may be, for example, 10 nanometers to 20 nanometers thick.

Contact metal 216 is disposed on the substrate 202 in the source 210 and drain 212. A field plate dielectric layer 218 is disposed over the gate 208 and the high performance silicon nitride layer 206, around the contact metal 216. Source metal 220 makes an electrical connection to the contact metal 216 in the source 210 and overlaps the gate 208 and extends partway to the drain 212 over the field plate dielectric layer 218 to provide a field plate for the GaN FET 214. Drain metal 222 makes electrical connection to the contact metal 216 in the drain 212. Additional dielectric layers and metal layers may be formed to provide low resistance connections to the GaN FET 214.

The low stress of the high performance silicon nitride layer 206 advantageously improves on-state current in the GaN FET 214 compared to a GaN FET with a silicon nitride layer having high stress. The low hydrogen content of the high performance silicon nitride layer 206 advantageously reduces charge trapping and improves reliability of the GaN FET 214 compared to a GaN FET with a silicon nitride layer having a high hydrogen content.

Figure 3A:
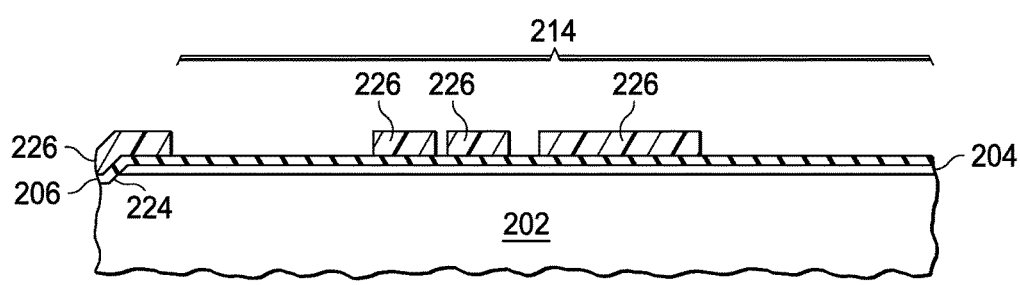
FIG. 3A and FIG. 3B are cross sections of the semiconductor device of FIG. 2, depicted in key stages of formation.
Figure 3B:
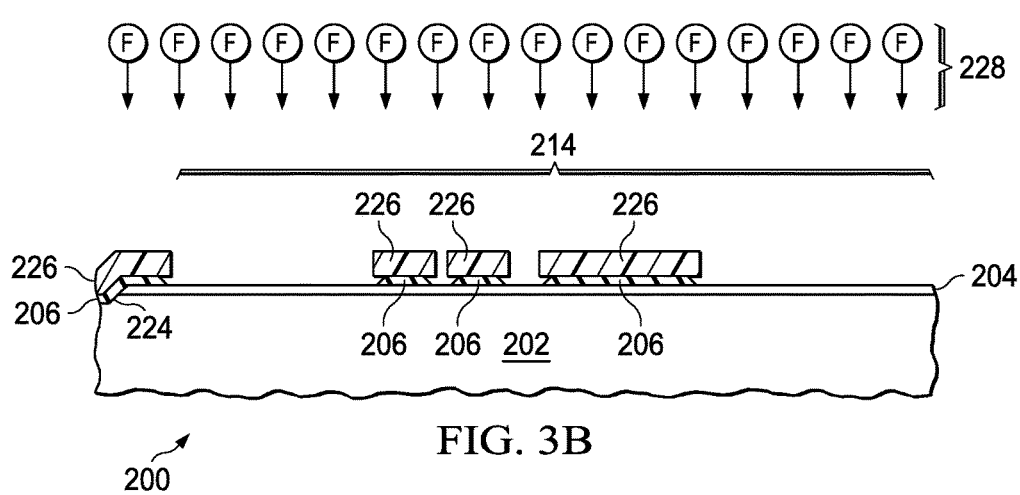

FIG. 3A and FIG. 3B are cross sections of the semiconductor device of FIG. 2, depicted in key stages of formation. Referring to FIG. 3A, the cap layer 204 is formed on the substrate 202 by an epitaxial process. A portion of the cap layer 204 and the substrate 202 may be removed to provide a lateral isolation boundary 224 for the GaN FET 214. The high performance silicon nitride layer 206 is formed on the cap layer 204 by an LPCVD process as described in reference to FIG. 1. An etch mask 226 is formed over the high performance silicon nitride layer 206 to cover areas for the high performance silicon nitride layer 206 of the completed GaN FET 214 of FIG. 2. The etch mask 226 may include photoresist formed by a photolithographic process, and may possibly include an anti-reflection layer.

Referring to FIG. 3B, a reactive ion etch (ME) process 228 containing fluorine (F) removes the high performance silicon nitride layer 206 where exposed by the etch mask 226. Reactant gas flows and a pressure in the RIE process 228 may be adjusted to provide sloped edges on the high performance silicon nitride layer 206 as depicted in FIG. 3B. Subsequently, the etch mask 226 is removed, for example by an ash process. Fabrication of the semiconductor device 200 is continued to provide the structure of FIG. 2. The method described in reference to FIG. 3A and FIG. 3B advantageously provides the patterned high performance silicon nitride layer 206 with the desired properties of low stress and low hydrogen content.

Figure 4:
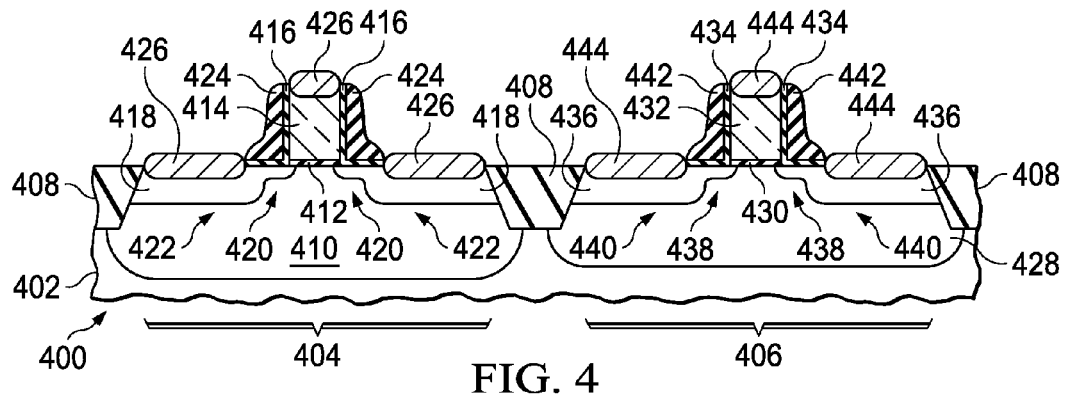
FIG. 4 is a cross section of an example integrated circuit with a high performance silicon nitride layer.

FIG. 4 is a cross section of an example integrated circuit with a high performance silicon nitride layer. The integrated circuit 400 is formed on a semiconductor substrate 402 such as a silicon wafer. The integrated circuit 400 includes a p-channel metal oxide semiconductor (PMOS) transistor 404 and/or an n-channel metal oxide semiconductor (NMOS) transistor 406. Field oxide 408 is disposed in the substrate 402 to laterally isolate the PMOS transistor 404 and the NMOS transistor 406.

The PMOS transistor 404 is disposed in an n-type well 410 extending below the field oxide 408. The PMOS transistor 404 includes a gate dielectric layer 412 on the n-type well 410 and a gate 414 on the gate dielectric layer 412. Offset spacers 416 are disposed on lateral surfaces of the gate 414. P-type source and drain regions 418 are disposed in the n-type well 410 on two sides of the gate 414. The source and drain regions 418 include source/drain extensions 420 extending under the gate 414 and deep source/drain regions 422 adjacent to the gate 414.

Gate sidewall spacers 424 are disposed adjacent to the gate 414, on the offset spacers 416. The gate sidewall spacers 424 include one or more layers of high performance silicon nitride, with low stress and low hydrogen content. Metal silicide 426 is disposed on the source and drain regions 418 adjacent to the gate sidewall spacers 424, and possibly on the gate 414. The gate sidewall spacers 424 provide lateral separation between a channel layer immediately below the gate dielectric layer 412 and the deep source/drain regions 422, and between the channel layer and the metal silicide 426 on the source and drain regions 418. The high performance silicon nitride in the gate sidewall spacers 424 may be within 10 nanometers of the semiconductor substrate 402. The low stress of the gate sidewall spacers 424 may advantageously reduce stress in the channel layer, and so improve an on-state current and/or an off-state current of the PMOS transistor 404. The low hydrogen content of the gate sidewall spacers 424 may advantageously improve reliability of the PMOS transistor 404.

Similarly, the NMOS transistor 406 is disposed in a p-type well 428 extending below the field oxide 408. The NMOS transistor 406 includes a gate dielectric layer 430 on the p-type well 428 and a gate 432 on the gate dielectric layer 430. Offset spacers 434 are disposed on lateral surfaces of the gate 432. N-type source and drain regions 436 are disposed in the p-type well 428 on two sides of the gate 432. The source and drain regions 436 include source/drain extensions 438 extending under the gate 432 and deep source/drain regions 440 adjacent to the gate 432. Gate sidewall spacers 442 including one or more high performance silicon nitride layers are disposed adjacent to the gate 432. The gate sidewall spacers 424 of the PMOS transistor 404 and the gate sidewall spacers 424 of the NMOS transistor 406 may possibly have a same layer structure as a result of being formed concurrently. Metal silicide 444 is disposed on the source and drain regions 436 adjacent to the gate sidewall spacers 442, and possibly on the gate 432. The NMOS transistor may accrue advantages from the low stress and low hydrogen content of the gate sidewall spacers 442 similar to those described in reference to the PMOS transistor 404.

Figure 5A:
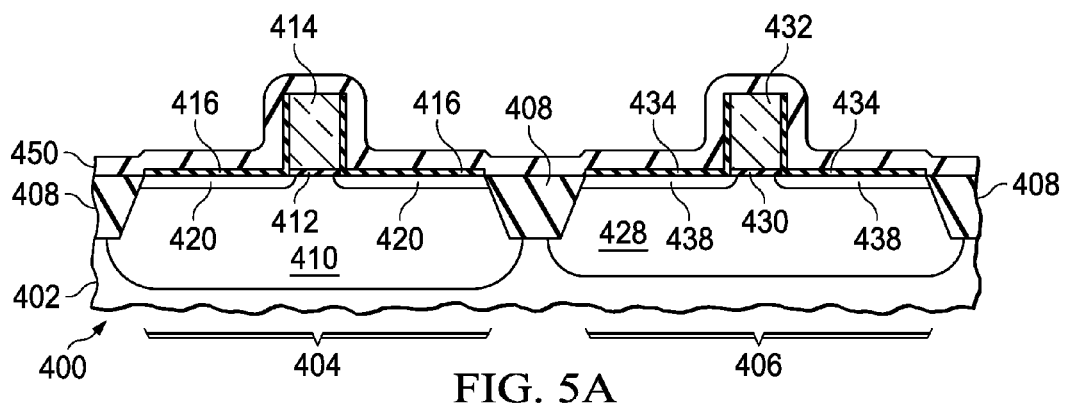
FIG. 5A and FIG. 5B are cross sections of the integrated circuit of FIG. 4, depicted in key stages of fabrication.
Figure 5B:
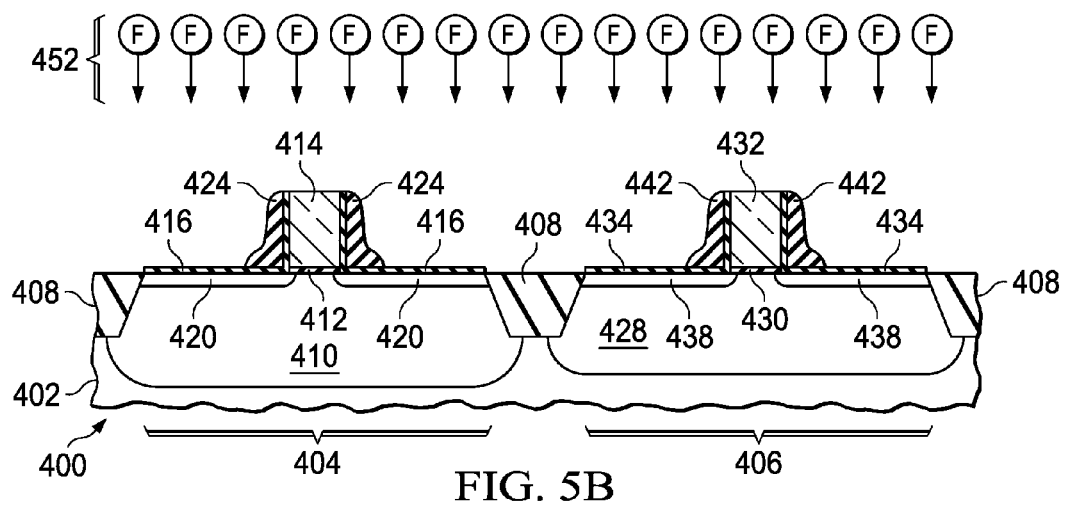

FIG. 5A and FIG. 5B are cross sections of the integrated circuit of FIG. 4, depicted in key stages of fabrication. Referring to FIG. 5A, the p-type source/drain extensions 420 are formed by implanting p-type dopants into the n-type well 410 using the gate 414 and offset spacers 416 of the PMOS transistor 404 as an implant mask, so that the source/drain extensions 420 do not extend completely under the gate 414. Similarly, the n-type source/drain extensions 438 are formed by implanting n-type dopants into the p-type well 428 using the gate 432 and offset spacers 434 of the NMOS transistor 406 as an implant mask, so that the source/drain extensions 438 do not extend completely under the gate 432. The substrate 402 is subsequently annealed to activate the implanted dopants.

A high performance silicon nitride layer 450 is formed over the gate 414, the offset spacers 416 and the source/drain extensions 420 of the PMOS transistor 404 and over the gate 432, the offset spacers 434 and the source/drain extensions 438 of the NMOS transistor 406. The high performance silicon nitride layer 450 is formed by an LPCVD process as described in reference to FIG. 1, which provides at least a partially conformal layer as depicted in FIG. 5A, so that a thickness of the high performance silicon nitride layer 450 on vertical surfaces of the offset spacers 416 and 434 is sufficient to form the gate sidewall spacers 424 and 442 of FIG. 4, respectively.

Referring to FIG. 5B, an anisotropic RIE process 452 containing fluorine (F) removes the high performance silicon nitride layer 450 of FIG. 5A over horizontal surfaces of the gate 414 and the source/drain extensions 420 of the PMOS transistor 404 and over the gate 432 and the source/drain extensions 438 of the NMOS transistor 406, leaving the high performance silicon nitride layer 450 to form the gate sidewall spacers 424 on the vertical surfaces of the offset spacers 416 of the PMOS transistor 404, and to form the gate sidewall spacers 442 on the vertical surfaces of the offset spacers 434 of the NMOS transistor 406. The conformal aspect of the LPCVD process to form the high performance silicon nitride layer 450 enables the gate sidewall spacers 424 and 442 to be formed without a photolithographic operation, advantageously reducing fabrication cost and complexity of the integrated circuit 400.

Figure 6A:
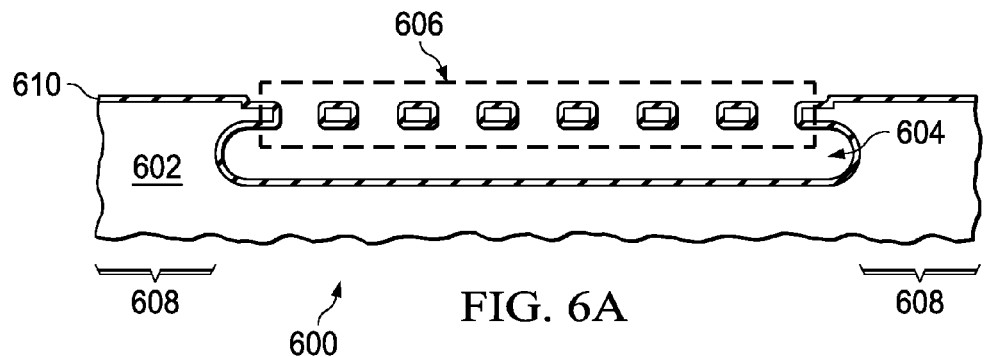
FIG. 6A and FIG. 6B are cross sections of an example microelectronic mechanical system (MEMS) device with a high performance silicon nitride layer, depicted in key stages of fabrication.
Figure 6B:
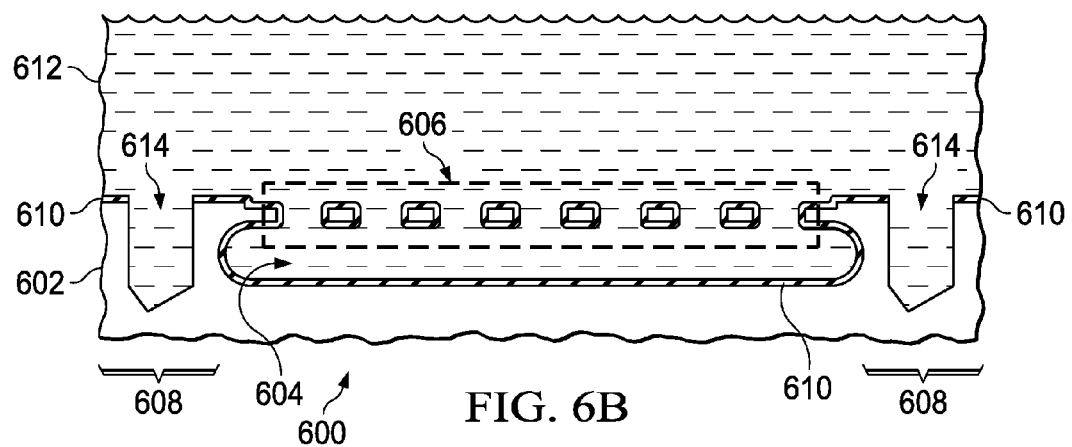

FIG. 6A and FIG. 6B are cross sections of an example microelectronic mechanical system (MEMS) device with a high performance silicon nitride layer, depicted in key stages of fabrication. Referring to FIG. 6A, the MEMS device 600 is formed in a silicon substrate 602, such as a single crystalline silicon wafer. A cavity 604 is formed in the substrate 602 leaving material of the substrate 602 above the cavity 604 in the form of a cantilevered element 606 such as a perforated membrane 606. The perforated membrane 606 may be part of a sensor, such as a thermal sensor or a microphone, or may be part of an actuator such as a speaker. It may be desirable to partially isolate the perforated membrane 606 from adjacent regions 608 of the substrate 602. A layer of high performance silicon nitride 610 is formed on the perforated membrane 606 and interior surfaces of the cavity 604 and adjacent regions 608 of the substrate 602. The high performance silicon nitride layer 610 is formed by an LPCVD process as described in reference to FIG. 1 to have low stress and a low hydrogen content, which provides at least a partially conformal layer, so that the high performance silicon nitride layer 610 covers all exposed surfaces of the perforated membrane 606 as depicted in FIG. 6A. Due to restricted access to the cavity 604 through the perforated membrane 606, the high performance silicon nitride layer 610 is thicker on a top surface of the perforated membrane 606 outside of the cavity 604 than on a bottom surface of the perforated membrane 606 facing the cavity 604. The low stress of the high performance silicon nitride layer 610 advantageously reduces deformation of the perforated membrane 606 due to the unequal thickness on the top and bottom surfaces of the perforated membrane 606.

Referring to FIG. 6B, the high performance silicon nitride layer 610 is removed from a portion of the substrate 602 in the regions 608 adjacent to the perforated membrane 606. The MEMS device 600 is immersed in a crystallographic wet etch solution 612, such as a potassium hydroxide solution, which removes silicon from the substrate 602 in the areas exposed by the high performance silicon nitride layer 610 along crystal planes of the substrate 602 to form isolation cavities 614 adjacent to the perforated membrane 606. The low hydrogen content of the high performance silicon nitride layer 610 advantageously provides etch resistance to the crystallographic wet etch solution 612 at a desired thickness. The MEMS device 600 is subsequently rinsed and dried. The high performance silicon nitride layer 610 may be left in place in the completed MEMS device 600 or may be removed during subsequent fabrication processes.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A Gallium-Nitride Field Effect Transistor (GaN FET) device, comprising:
    a stack of gallium nitride and aluminum gallium nitride layers as a substrate;
    a cap layer of gallium nitride on the stack;
    a silicon nitride layer on a first surface of the cap layer, the silicon nitride layer having the following properties:
        a silicon:nitrogen atomic ratio within 2 percent of the ratio 3:4;
        a stress of 600 megapascals (MPa) to 1000 MPa; and
        a hydrogen content of less than 5 atomic percent; and
    a gate of the GaN FET over the cap layer, wherein the gate is in direct contact with the first surface of the cap layer at a center portion of the gate and partially overlaps the silicon nitride layer at end portions of the gate.

2. The device of claim 1, wherein the silicon nitride layer is less than 25 nanometers thick.

3. The device of claim 1, wherein the silicon nitride layer has an index of refraction of 2.0 to 2.1.

4. The device of claim 1, wherein the silicon nitride layer has a dielectric breakdown strength of greater than 12 megavolts per centimeter (MV/cm).

5. The device of claim 1, further comprising a source and a drain.

6. The device of claim 5, further comprising a source metal in electrical contact with a contact metal of the source, the source metal overlapping the gate.

7. The device of claim 6, further comprising a dielectric layer between the source metal and the gate.

8. The device of claim 5, wherein the silicon nitride includes a first portion under the end portions of the gate and a second portion between the gate and the drain spaced from both the drain and the gate.

9. A Gallium-Nitride Field Effect Transistor (GaN FET) device, comprising:
  a stack of gallium nitride and aluminum gallium nitride layers as a substrate;
  a cap layer of gallium nitride on the stack;
  a silicon nitride layer on a first surface of the cap layer, the silicon nitride layer having the following properties:
    a silicon:nitrogen atomic ratio within 2 percent of the ratio 3:4;
    a stress of 600 megapascals (MPa) to 1000 MPa; and
    a hydrogen content of less than 5 atomic percent;
  a source and a drain, wherein the silicon nitride layer is located between the source and drain; and
  a gate of the GaN FET over the cap layer between the source and drain, wherein the gate is in direct contact with the first surface of the cap layer at a center portion of the gate and partially overlaps the silicon nitride layer at end portions of the gate.

10. The device of claim 9, further comprising a source metal in electrical contact with a contact metal of the source, the source metal overlapping the gate.

11. The device of claim 10, further comprising a dielectric layer between the source metal and the gate.

12. The device of claim 9, wherein the silicon nitride includes a first portion under the end portions of the gate and a second portion between the gate and the drain spaced from both the drain and the gate.

13. A Gallium-Nitride Field Effect Transistor (GaN FET) device, comprising:
  a stack of gallium nitride and aluminum gallium nitride layers;
  a cap layer of gallium nitride on the stack;
  a silicon nitride layer on the cap layer, the silicon nitride layer having the following properties:
    a silicon:nitrogen atomic ratio within 2 percent of the ratio 3:4;
    a stress of 600 megapascals (MPa) to 1000 MPa; and
    a hydrogen content of less than 5 atomic percent;
  a source and a drain;
  a gate of the GaN FET over the cap layer between the source and drain, wherein the gate is in direct contact with the cap layer at a center portion of the gate and partially overlaps the silicon nitride layer at end portions of the gate;
  a source metal in electrical contact with a contact metal of the source, the source metal overlapping the gate; and
  a dielectric layer between the source metal and the gate, wherein the silicon nitride includes a first portion under the end portions of the gate and a second portion between the gate and the drain spaced from both the drain and the gate.

* * * * *